(12) United States Patent
Frith et al.

(10) Patent No.: US 9,806,684 B2
(45) Date of Patent: Oct. 31, 2017

(54) METHOD AND APPARATUS FOR ACHIEVING VERY HIGH-OUTPUT SIGNAL SWING FROM CLASS-D AMPLIFIER

(71) Applicant: ESS Technology, Inc., Milpitas, CA (US)

(72) Inventors: Peter John Frith, Kelowna (CA); Yongsheng Xu, Kelowna (CA); A. Martin Mallinson, Kelowna (CA); Robert Lynn Blair, Pleasanton, CA (US)

(73) Assignee: ESS Technology, Inc., Milpitas, CA (US)

( * ) Notice: Subject to any disclaimer, the term of this patent is extended or adjusted under 35 U.S.C. 154(b) by 0 days.

(21) Appl. No.: 15/261,939

(22) Filed: Sep. 10, 2016

(65) Prior Publication Data

US 2017/0111017 A1    Apr. 20, 2017

Related U.S. Application Data

(60) Provisional application No. 62/217,596, filed on Sep. 11, 2015, provisional application No. 62/362,347, filed on Jul. 14, 2016.

(51) Int. Cl.
*H03F 3/217* (2006.01)
*H03F 3/185* (2006.01)
*H03F 1/02* (2006.01)

(52) U.S. Cl.
CPC ......... *H03F 3/2173* (2013.01); *H03F 1/0233* (2013.01); *H03F 3/185* (2013.01); *H03F 2200/03* (2013.01)

(58) Field of Classification Search
USPC ....................................... 330/10, 251, 207 A
See application file for complete search history.

(56) References Cited

U.S. PATENT DOCUMENTS 8,643,436 B2 *  2/2014  Ni ........................... H03F 3/217
                                                     330/207 A
8,861,748 B2 * 10/2014  Dooper ................. H03F 3/2178
                                                        330/251

* cited by examiner

*Primary Examiner* — Hieu Nguyen
(74) *Attorney, Agent, or Firm* — Gard & Kaslow LLP

(57) ABSTRACT

An apparatus and method are disclosed for providing output signal swings that are greater than the supply voltage in a class-D amplifier. The amplifier circuit boosts the voltage across the amplifier load, such as a loudspeaker, by using capacitors to "charge pump" the voltage across the load and thus increase the voltage temporarily. This is done by using two or more output bridges rather than one, and connecting the bridges through the capacitors. For signals of less than the supply voltage, only an inner bridge, similar to a full bridge of the prior art, operates. For signals above the supply voltage, an outer bridge charges capacitors, which are then used to 'boost' the voltage on the bridge output for the short period of the Class-D switching period. Thus, only relatively small value boosting capacitors are needed, as they do not need to supply charge for very long.

16 Claims, 14 Drawing Sheets

METHOD AND APPARATUS FOR ACHIEVING VERY HIGH-OUTPUT SIGNAL SWING FROM CLASS-D AMPLIFIER

This application claims priority from Provisional Applications Nos. 62/217,596, filed Sep. 11, 2015, and 62/362,347, filed Jul. 14, 2016, which are incorporated by reference herein in their entirety.

FIELD OF THE INVENTION

The present invention relates generally to amplifiers, and more particularly to class-D amplifiers.

BACKGROUND OF THE INVENTION

A class-D amplifier or switching amplifier is an electronic amplifier in which the amplifying devices (which are transistors, usually field effect transistors, i.e., FETs) operate as electronic switches, and not as linear gain devices as in other amplifiers. Such amplifiers are well known to those of skill in the art as an architecture that can achieve high amplification with high efficiency.

The signal to be amplified is a train of constant amplitude pulses, so the active devices switch rapidly back and forth between their fully conductive and nonconductive states. The analog signal to be amplified is converted to a series of digital pulses by pulse width modulation, pulse density modulation or other method before being applied to the amplifier.

After amplification, the output pulse train can be converted back to an analog signal by passing it through a passive low pass filter consisting of inductors and capacitors. (In some applications the low pass filter is omitted and the inherent bandwidth of the transducer, such as a loudspeaker, functions as the low pass filter.) The major advantage of a class-D amplifier is that it is typically more efficient than comparable analog amplifiers, with less power dissipated as heat in the active devices.

Output stages such as those used in pulse generators are examples of class-D amplifiers. However, the term mostly applies to power amplifiers intended to reproduce signals with a bandwidth well below the switching frequency.

FIG. 1 is an illustration of a class-D amplifier 100 in a basic single-ended output, or half bridge, design. The input signal 102 is combined with a triangular wave signal to produce a train of square pulses 104 of fixed amplitude but varying width and separation; the low-frequency portion of the signal is the signal to be amplified, while the high-frequency portion makes the waveform binary.

The pulse train 104 is amplified by the output stage 106, resulting in a pulse train 108 having the same frequency spectrum, but with greater amplitude. The amplified pulse train 108 is then converted back to an analog signal by passing it through low pass filter 110, which removes the unwanted high-frequency components, and the analog signal then passed to loudspeaker (or other load) 112. The low-pass filter 110 is of high efficiency due to the use of only reactive components, such as inductors and capacitors.

In some applications, particularly those used in portable mobile devices, the inductor which is part of the low-pass filter 110, and which is in series with the loudspeaker load, may be omitted. This is because the inductance of the loudspeaker voice coil may be enough to perform the filtering of the switching waveform needed to remove the high frequency components of the driving waveform.

While the load is illustrated as a loudspeaker in FIG. 1 and other figures herein, one of skill in the art will appreciate that non-audio applications, and loads other than loudspeakers, can benefit from the invention described herein.

As is known in the art, the output power of this amplifier is limited by the value of the supply voltage $V_{DD}$ used at the output stage. In many applications of a class-D amplifier, the supply voltage is obtained from a battery. For example, portable mobile devices are often powered by lithium batteries that may have a primary voltage of around 4.2 volts (V) when fully charged, falling to perhaps 3.2V as the battery is discharged. As a result, the output power that can be delivered into a loudspeaker load having, for example, a resistance value that might typically be 8 Ohms is limited to only a few hundred milliwatts or less.

In one attempt to overcome this limitation, the class-D amplifier circuit is often modified to create a second, complimentary output so that the loudspeaker load is now driven from both ends in opposite phases. This is well known as "balanced" or "differential" driving; the output stage is typically referred to as a "full bridge" or "H-bridge" circuit, and the loudspeaker or other load is referred to as a "bridge-tied" load ("BTL"). A controller (not shown) provides the inputs to the two sides of the bridge in opposite phases.

FIG. 2 is an illustration of a differential class-D amplifier output stage 200 using a full bridge circuit. The output bridge is comprised of FET transistors $MH_A$, $ML_A$, $MH_B$, and $ML_B$, to which the input signal is fed by a controller (not shown). In this configuration the output voltage swing has doubled as there is now a second complementary output so that the loudspeaker load is now driven from both ends in opposite phases. Since power is proportional to the square of the voltage across the load, the power delivered to the loudspeaker is nominally increased by four. As is known in the art, for the loudspeaker load to be driven in a differential fashion, each side of the bridge must be a mirror image of the other, and thus able to provide the same voltages, in opposite phases as above.

In the circuit of FIG. 2, as is typical in the art, transistors $MH_A$ and $MH_B$ are p-channel metal oxide semiconductor (PMOS) transistors, while transistors $ML_A$ and $ML_B$ are n-channel metal oxide semiconductor (NMOS) transistors, although this is not necessary. Those of skill in the art will appreciate the difficulties involved in using NMOS transistors rather than PMOS transistors and vice versa. Because PMOS devices have a lower conductivity than NMOS devices for any given physical size, it is not uncommon to use a bridge where all the devices are NMOS devices, even though this makes the drive waveforms more difficult to generate, because the NMOS devices that are substituted for the PMOS devices require a gate drive above the maximum supply to the bridge.

However, even the increase in power from circuit 200 will only produce just over a watt of average power in a mobile device from a 3.6 volt supply voltage into an 8 ohm load (3.6×3.6×1/8×0.707=1.134 watts). In an automotive application with a 12 volt supply voltage and a 4 ohm load, the average power would be about 25 watts (12×12×¼× 0.707=25.4 watts).

At these maximum power levels the control signals to the output bridge will tend towards a 100% duty cycle. That is, the bridge is almost permanently on one way, steering current into the load. In this situation the amplifier has become 'saturated' and cannot produce more power in response to a larger input signal. The bridge thus can no longer behave in a linear fashion, and the signal becomes 'clipped' at its maximum level, a form of heavy distortion.

As a result, it is desirable to design an amplifier in a way that avoids this 'clipping' condition, although some designs have the effect of further reducing the output power.

In order to increase these power levels, the signal swings across the loudspeaker load must be increased. One typically way of achieving this is by 'boosting' the supply voltage to the full bridge output stage. In some cases, this is done by using standard supply circuit design techniques such as switch mode boost converter circuits.

FIG. 3 is a block diagram of one commercial implementation of a class-D amplifier 300 that uses such a boost converter combined with a full bridge output amplifier. This form of supply voltage boosting uses a discrete inductor component LX and the design of a controller ("CONTROL") 302. The use of a boost converter 304 results in a supply voltage $V_{CCOUT}$ that might, for example, be 9 to 12 volts rather than the nominal battery voltage of about 4 volts. The increased voltage $V_{CCOUT}$ goes to the output stage 306 to increase the power to the loudspeaker load.

The controller 302 looks at the input signal and determines whether the input signal is such that a boost of supply voltage is needed; if a boost is appropriate, the boost converter 304 is activated. However, it is desirable that the boost converter 304 not run all the time, as this will drain the battery faster than when the boost converter 304 is not active. Thus, to optimize efficiency of the amplifier 300, the controller 302 only activates the boost converter 304 when the desired output signal of the amplifier becomes large enough to require the increase in supply voltage that the boost converter 304 provides. In some embodiments, the supply voltage can be made to "track" the signal level, further increasing efficiency of the amplifier 300, although at the cost of increased circuit complexity.

Further, boost converters are inconvenient, both due to the additional cost of inductors over capacitors, and, more importantly, the physical size of inductors. The height of an inductor on a printed circuit board may be 2 to 3 millimeters (mm), while a capacitor is less than 1 mm high. This places a limitation on the design of, for example, a smartphone. Finally, to limit the size of the inductor, it is desirable to drive it at a high frequency, such as 1 megahertz (Mhz), which can cause electromagnetic interference.

Another possible solution is a charge pump, a device well known in the art that is frequently used to create larger or smaller supply voltages for many applications. Charge pumps create continuous supply voltages that can be used to power circuits in a manner similar to the inductor based boost circuit above. However, charge pumps with physically small capacitors must run at high speeds, which reduces their efficiency. Also, as opposed to inductive boost circuits, charge pumps are unable to efficiently provide a continuous voltage and thus cannot efficiently track the optimum supply level.

An example of such a charge pump implementation is seen in the TDA1560 audio amplifier from NXP Semiconductors N.V. (previously Philips Semiconductors), which uses a large electrolytic capacitor to lift the supply voltage during large audio signal peaks, thus achieving larger peak output power levels. In this case the maximum output power and minimum signal frequency are functions of the capacitor value that is chosen in the range 2200 microfarads or larger. The reason the capacitor in this application must be so large is that the capacitor must hold enough charge to supply current into the load for the much longer duration (milliseconds) of an audio signal peak, rather than the short duration (microseconds) of a class-D switching period. Again, this is not a useful solution for portable devices.

These issues limit the power available to drive a loudspeaker or other load device, particularly in mobile applications.

SUMMARY OF THE INVENTION

A method and apparatus is disclosed which provides output signal swings greater than the supply voltage in a class-D amplifier, without requiring an increase in the supply voltage to the amplifier. This allows the output signal range of the amplifier to go beyond the limits of the supply voltage in a full bridge circuit.

One embodiment discloses a class-D amplifier for providing a series of output pulses to a load, the output pulses representing an input signal, comprising: four half bridge switching circuits, each half bridge switching circuit having a PMOS transistor and an NMOS transistor, the gate of each PMOS and NMOS transistor receiving a series of input pulses representing the input signal, the source of each PMOS transistor coupled to a positive power supply, the source of each NMOS transistor coupled to a negative power supply, and the drain of the PMOS transistor in each half bridge connected to the drain of the NMOS transistor in the same half bridge; the drains of both transistors of a first half bridge switching circuit connected to one side of the load and the drains of both transistors of a second half bridge switching circuit connected to the opposite side of the load; a first capacitor having a positive terminal connected to the drains of both transistors of the first half bridge and a negative terminal connected to the drains of both transistors of a third half bridge; and a second capacitor having a positive terminal connected to the drains of both transistors of the second half bridge and a negative terminal connected to the drains of the transistors of a fourth half bridge.

Another embodiment discloses a class-D amplifier for providing a series of output pulses to a load, the output pulses representing an input signal, comprising: four half bridge switching circuits, each half bridge switching circuit having a first transistor and a second transistor, the gate of each first and second transistor receiving a series of input pulses representing the input signal, the source of each first transistor coupled to a positive power supply, the source of each second transistor coupled to a negative power supply, and the drain of the first transistor in each half bridge connected to the drain of the second transistor in the same half bridge; the drains of both transistors of a first half bridge switching circuit connected to one side of the load and the drains of both transistors of a second half bridge switching circuit connected to the opposite side of the load; a first capacitor having a positive terminal connected to the drains of both transistors of the first half bridge and a negative terminal connected to the drains of both transistors of a third half bridge; and a second capacitor having a positive terminal connected to the drains of both transistors of the second half bridge and a negative terminal connected to the drains of the transistors of a fourth half bridge.

A further embodiment discloses a method of operating a class-D amplifier to provide a series of amplified output pulses to a load, the output pulses representing an input signal, wherein the class-D amplifier comprises four half bridge switching circuits, each half bridge switching circuit having a first transistor and a second transistor, the gate of each first and second transistor receiving a digitized input audio signal, the source of each first transistor coupled to a positive power supply voltage, the source of each second transistor coupled to a negative power supply voltage, and the drain of the first transistor in each half bridge connected to the drain of the second transistor in the same half bridge, the drains of both transistors of a first half bridge switching circuit connected to one side of the load and the drains of both transistors of a second half bridge switching circuit connected to opposite sides of the load, a first capacitor having a positive terminal connected to the drains of both transistors of the first half bridge and a negative terminal connected to the drains of both transistors of a third half bridge; and a second capacitor having a positive terminal connected to the drains of both transistors of the second half bridge and a negative terminal connected to the drains of the transistors of a fourth half bridge, the method comprising: determining, by a controller, that the input signal voltage either does or does not extend above the upper limit of the positive power supply voltage or below the lower limit of the negative power supply voltage; if the input signal voltage does not extend above the upper limit of the positive power supply voltage or below the lower limit of the negative power supply voltage, causing, by the controller, each of the transistors to be separately activated or not activated such that the input signal is amplified by the first and second half bridge switching circuits and an amplified output signal provided to the load without any contribution from any voltage on the first and second capacitors so that the voltage applied to the load is a difference between the positive power supply voltage and the negative power supply voltage; if the input signal voltage extends above the upper limit of the positive power supply voltage or below the lower limit of the negative power supply voltage, causing, by the controller, each of the transistors to be separately activated or not activated such that the input signal is amplified by all of the half bridge switching circuits and an amplified output signal provided to the load with a contribution from a voltage on each of the first and second capacitors.

Still another embodiment discloses a class-D amplifier for providing a series of output pulses to a load, the output pulses representing an input signal, comprising: six half bridge switching circuits, each half bridge switching circuit having a first transistor and a second transistor, the gate of each first and second transistor receiving a series of input pulses representing the input signal, the source of each first transistor coupled to a positive power supply, the source of each second transistor coupled to a negative power supply, and the drain of the first transistor in each half bridge connected to the drain of the second transistor in the same half bridge; the drains of both transistors of a first half bridge switching circuit connected to one side of the load and the drains of both transistors of a second half bridge switching circuit connected to the opposite side of the load; a first capacitor having a positive terminal connected to the drains of both transistors of the first half bridge and a negative terminal connected to the drains of both transistors of a third half bridge; a second capacitor having a positive terminal connected to the drains of both transistors of the second half bridge and a negative terminal connected to the drains of the transistors of a fourth half bridge; a third capacitor having a negative terminal connected to the drains of both transistors of the first half bridge and a positive terminal connected to the drains of both transistors of a fifth half bridge; and a fourth capacitor having a negative terminal connected to the drains of both transistors of the second half bridge and a positive terminal connected to the drains of the transistors of a sixth half bridge.

Another embodiment discloses a class-D amplifier for providing a series of output pulses to a load, the output pulses representing an input signal, comprising: four half bridge switching circuits comprised of eight transistors, each half bridge switching circuit having a first transistor and a second transistor, the gate of each first and second transistor receiving a series of input pulses representing the input signal, the source of each first transistor coupled to a positive power supply, the source of each second transistor coupled to a negative power supply, and the drain of the first transistor in each half bridge connected to the drain of the second transistor in the same half bridge; the drains of both transistors of a first half bridge switching circuit connected to one side of the load and the drains of both transistors of a second half bridge switching circuit connected to the opposite side of the load; a first capacitor having a negative terminal connected to the drains of both transistors of a third half bridge; a second capacitor having a positive terminal connected to the drains of both transistors of a fourth half bridge; ninth and tenth transistors, the sources of the ninth and tenth transistors connected to the positive terminal of the first capacitor, the drain of the ninth transistor connected to the drains of both transistors of the first half bridge switching circuit and the drain of the tenth transistor connected to the drains of both transistors of the second half bridge switching circuit; and eleventh and twelfth transistors, the sources of the eleventh and twelfth transistors connected to the negative terminal of the second capacitor, the drain of the eleventh transistor connected to the drains of both transistors of the first half bridge switching circuit and the drain of the twelfth transistor connected to the drains of both transistors of the second half bridge switching circuit.

Still a further embodiment discloses a method of operating a class-D amplifier to provide a series of amplified output pulses to a load, the output pulses representing an input signal, wherein the class-D amplifier comprises six half bridge switching circuits, each half bridge switching circuit having a first transistor and a second transistor, the gate of each first and second transistor receiving a digitized input audio signal, the source of each first transistor coupled to a positive power supply voltage, the source of each second transistor coupled to a negative power supply voltage, and the drain of the first transistor in each half bridge connected to the drain of the second transistor in the same half bridge, the drains of both transistors of a first half bridge switching circuit connected to one side of the load and the drains of both transistors of a second half bridge switching circuit connected to opposite sides of the load, a first capacitor having a positive terminal connected to the drains of both transistors of the first half bridge and a negative terminal connected to the drains of both transistors of a third half bridge; a second capacitor having a positive terminal connected to the drains of both transistors of the second half bridge and a negative terminal connected to the drains of the transistors of a fourth half bridge, a third capacitor having a negative terminal connected to the drains of both transistors of the first half bridge and a positive terminal connected to the drains of both transistors of a fifth half bridge, and a fourth capacitor having a negative terminal connected to the drains of both transistors of the second half bridge and a positive terminal connected to the drains of the transistors of a sixth half bridge, the method comprising: determining, by a controller, that the input signal voltage either does or does not extend above the upper limit of the positive power supply voltage or below the lower limit of the negative power supply voltage; if the input signal voltage does not extend above the upper limit of the positive power supply voltage or below the lower limit of the negative power supply voltage, causing, by the controller, each of the transistors to be separately activated or not activated such that the input signal is amplified by the first and second half bridge switching circuits and an amplified output signal provided to the load without any contribution from any voltage on the first and second capacitors so that the voltage applied to the load is a difference between the positive power supply voltage and the negative power supply voltage; if the input signal voltage extends above the upper limit of the positive power supply voltage or below the lower limit of the negative power supply voltage, determining, by the controller, which of the capacitors should contribute a voltage so that the input signal is amplified to the desired amount and causing each of the transistors to be separately activated or not activated such that the input signal is amplified by some or all of the third, fourth, fifth and sixth half bridge switching circuits and an amplified output signal provided to the load with a contribution from a voltage on some or all of the first, second, third and fourth capacitors.

DETAILED DESCRIPTION OF THE INVENTION

Described herein is a circuit that provides output signal swings greater than the supply voltage in a class-D amplifier beyond what is available in full bridge circuits of the prior art, without requiring an increase in the supply voltage to the amplifier. This allows the output signal range of the amplifier to go beyond the limits set by the supply voltage.

The circuit described herein boosts the voltage across the amplifier load, such as a loudspeaker, by using capacitors to "charge pump" the voltage across the load and thus increase the voltage momentarily, rather than requiring a continuous increase in voltage as in prior art charge pumps. This is done by using two or more output bridges rather than one, and connecting the bridges through the capacitors. For signals of less than the supply voltage, only an inner bridge, similar to a full bridge of the prior art, operates. For signals above the supply voltage, an outer bridge charges capacitors, which are then used to 'boost' the voltage on the bridge output for the short time of the Class-D switching period. Thus, only relatively small value boosting capacitors are needed, as they do not need to supply charge for very long.

Figure 1:
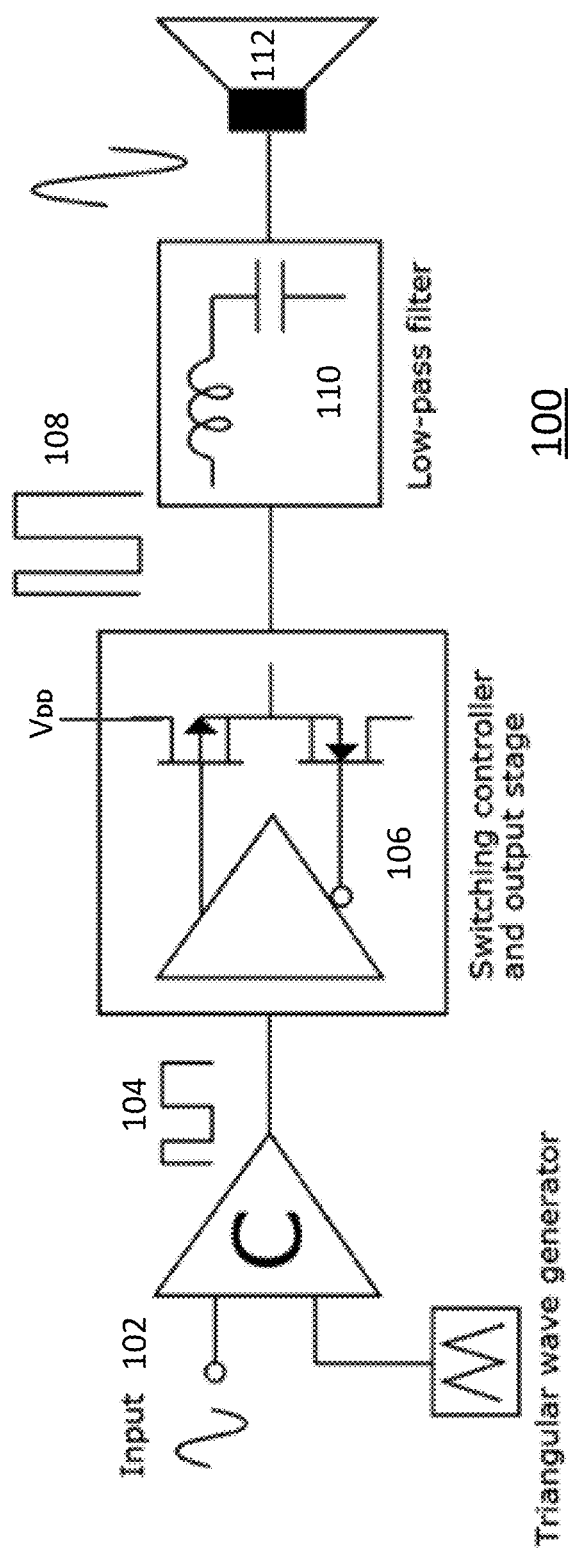
FIG. 1 is an illustration of a class-D amplifier 100 in a basic single-ended output design in the prior art.
Figure 2:
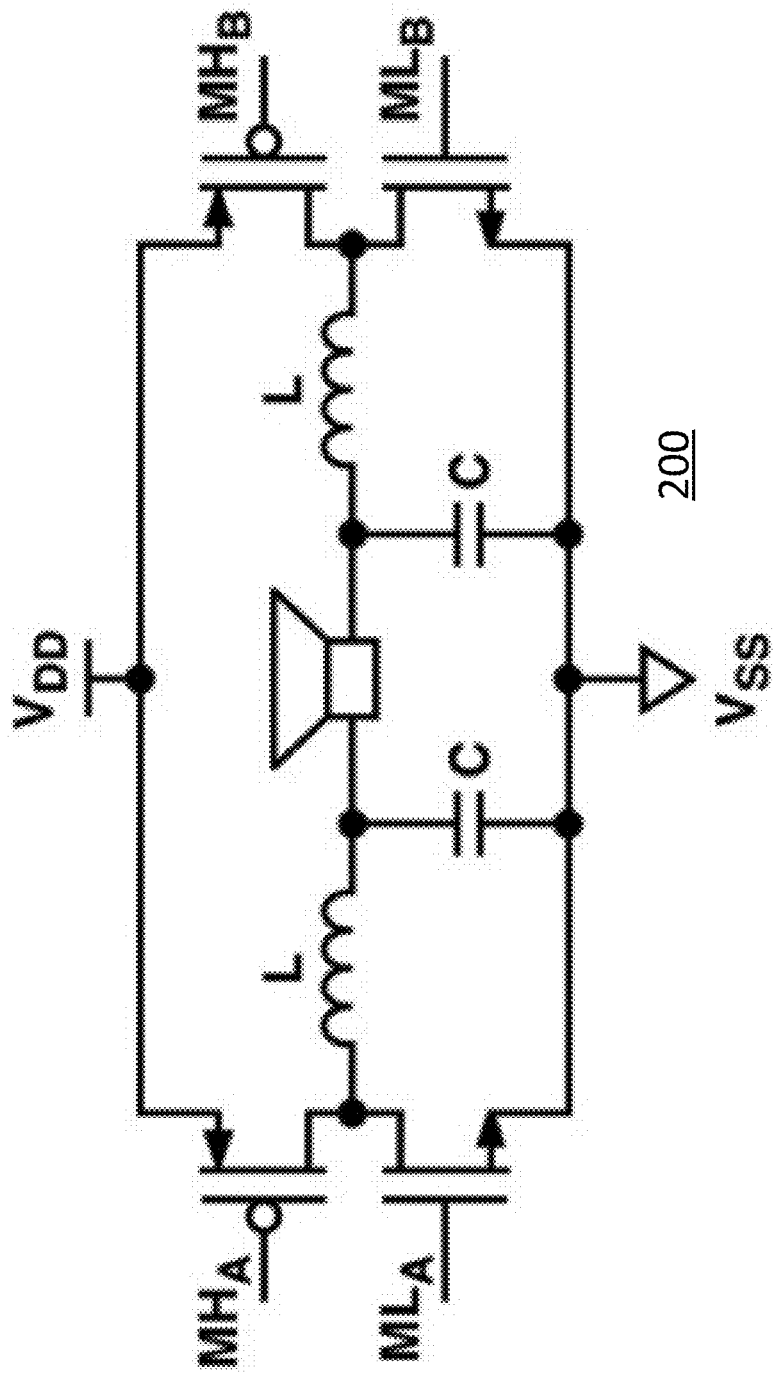
FIG. 2 is an illustration of a differential class-D amplifier output stage using a full bridge circuit in the prior art.
Figure 3:
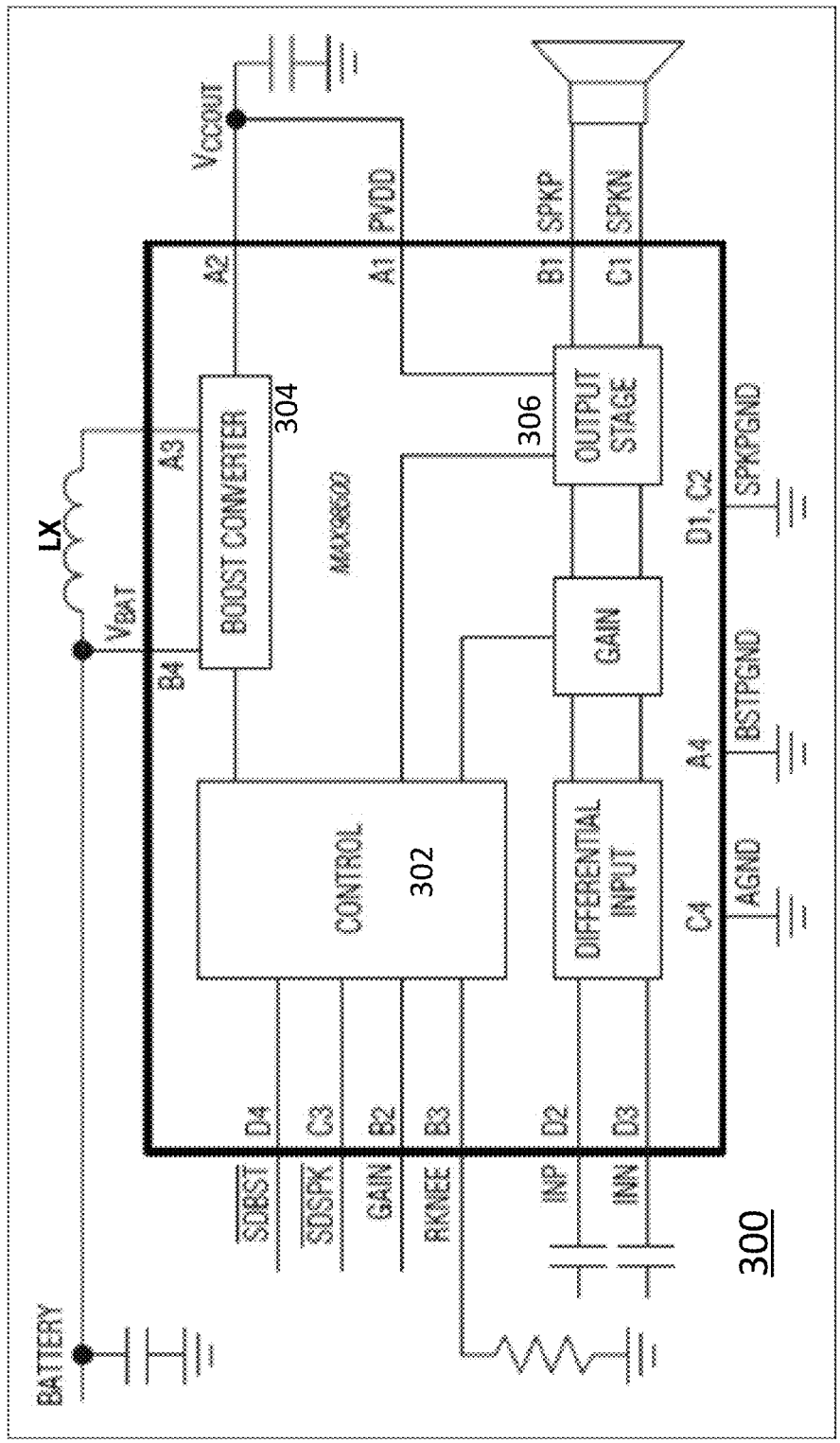
FIG. 3 is a block diagram of one commercial implementation of a class-D amplifier 300 that uses such a boost converter combined with a full bridge output amplifier in the prior art.
Figure 4:
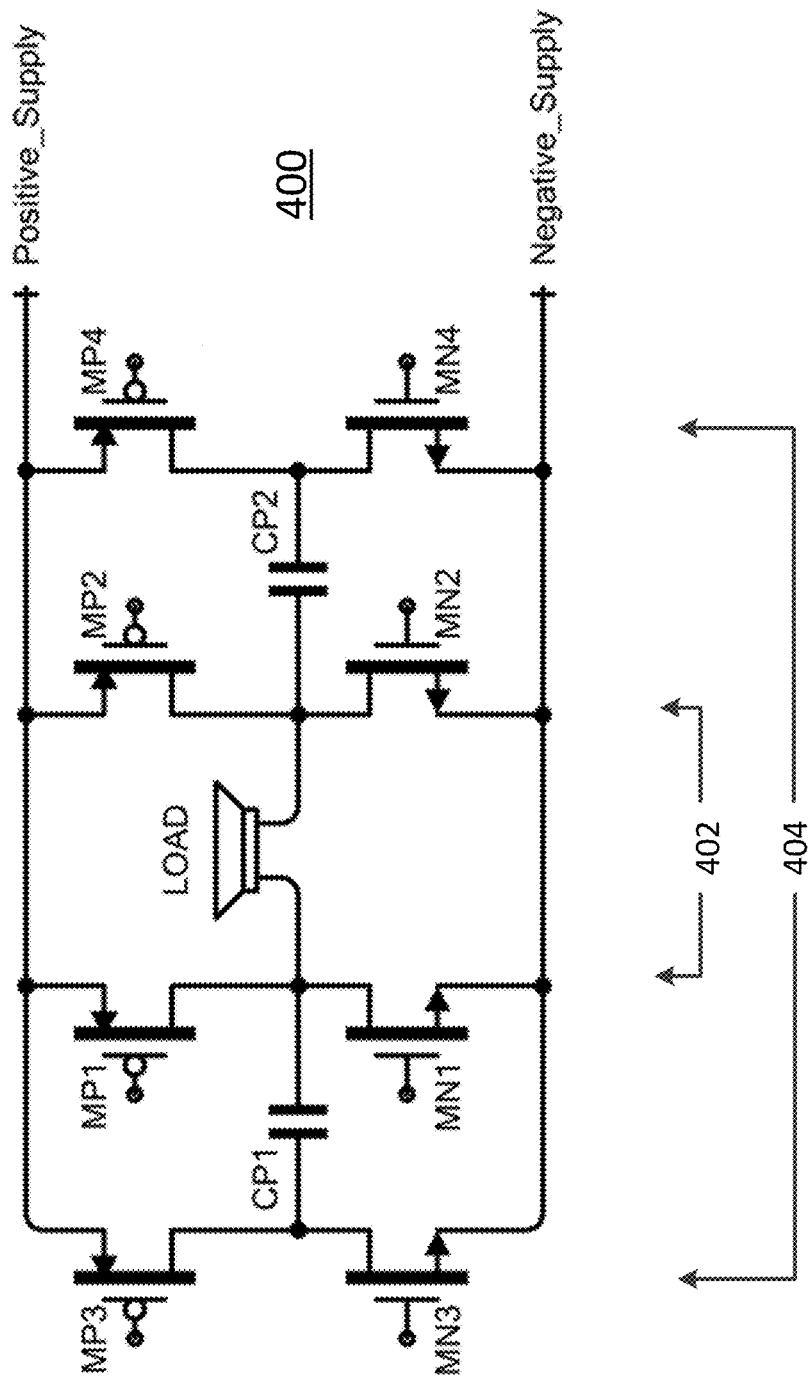
FIG. 4 is an illustration of an amplifier having dual bridges according to one embodiment.

FIG. 4 shows an amplifier 400 according to one embodiment. Note that only the power bridges are shown along with the boosting capacitors. The devices driving the gates of the switching devices are omitted, as is the low pass filter (as above, this may be provided by the load itself, i.e., the loudspeaker.) In this illustration, an amplifier having a full bridge configuration such as in FIG. 2 is shown, but the invention could also be used with a single ended bridge such as is shown in FIG. 1. Also, the bridges in FIG. 4 are shown as implemented using FETs, although in some embodiments alternative technologies could be used to implement the same switching functions. As above, the transistors connected to the positive power supply are typically PMOS transistors, and the transistors connected to the negative power supply are NMOS transistors.

The circuit 400 of FIG. 4 comprises a pair of similar, full output bridges. An inner bridge 402, directly equivalent to a standard class-D amplifier output bridge such as shown in FIG. 2, is connected directly to the load. The second, or 'outer,' bridge 404 is connected via capacitors Cp1 and Cp2 to the inner bridge 402 and to the load. The positive end of each capacitor, the right side of Cp1 and the left side of Cp2, is connected to the Load. Both bridges 402 and 404 are powered by the same power supply (or supplies), which are again typically provided from a battery and limited in amplitude. (The "negative power supply" is typically the ground of the positive power supply, but need not be in some embodiments.)

In operation, when the amplitude of the input signal is less than the supply voltages, no boosting is required and the amplifier behaves as a conventional class-D amplifier. Only the inner bridge 402 is active in this case and the outer bridge 404 remains inactive. The Load will see a voltage equal to the supply voltage; as above, in the case of a mobile device this will typically be about 4 volts (depending upon the charge level in the battery).

As discussed above, when the signal increases in amplitude and approaches the supply voltage(s), the duty cycle of the inner bridge 402 will approach 100%, i.e., the FETs are 'on' in one signal direction nearly all of the time. The output amplitude thus cannot increase further.

As the duty cycle of the inner bridge 402 approaches 100% the controller (not shown) causes the outer bridge 404 to begin to operate. The capacitors Cp1 and Cp2 are charged to a voltage corresponding to the supply voltage by turning on one of the FETs in each half of the outer bridge 404.

On the left side of circuit 400, for example, in operation for small input signals needing only the power that the inner bridge 402 can provide, FETs Mp1 and Mn3 are 'on' so that the capacitor Cp1 will be charged to the supply voltage, with the right side of Cp1 charged to the value of the positive supply voltage, and the left side of Cp1 charged to the negative supply voltage. The left side of the Load will see the positive supply voltage.

Similarly, on the right side of circuit 400, FETs Mp2 and Mn4 are 'on' so that the capacitor Cp2 will be charged to the supply voltage, with the left side of Cp2 charged to the value of the positive supply voltage, and the right side of Cp2 charged to the negative supply voltage. The right side of the Load will also see the positive supply voltage, in opposite phase to the left side as above.

When more power is needed, FETs Mp1 and Mn3 are then turned off and Mp3 is turned on. This results in the negative right end of Cp1 being pulled up to the positive supply voltage, which in turn has the effect of pulling up the left end of Cp1, which is connected to the loudspeaker ("Load"), and to FETs Mp1 and Mn1 which are now off. Thus, the voltage at the connection from Cp1 to the Load rises quickly to two times the supply voltage, as it was already at supply voltage and now has been pulled higher by the higher voltage on Cp1 as Mp3 turns on.

Similarly, again when more power is needed, the right side of the outer bridge 404 operates in a complementary fashion to the left side as described above. In this case, Mp2 is switched off, while Mp4 is switched on, pulling the right ("negative") end of capacitor Cp2 to the level of the positive voltage supply, and thus pulling the positive left end of capacitor Cp2 to a level higher than that of the positive voltage supply.

This increases the voltage applied to each side of the Load. Due to the operation of the outer bridge 404, each of capacitors Cp1 and Cp2 have increased the voltage applied to the Load by the amount of the positive voltage supply, or an additional 4 volts in the case of a 4 volt battery. Thus, the total voltage across the Load is two times the supply voltage, and the circuit will see 8 volts being applied to the Load rather than being limited to the 4 volts of the power supply.

As long as the input signal voltage remains larger than the supply voltage, for subsequent pulse waveforms the outer bridge 404 will continue to operate along with the inner bridge 402 to recharge the Cp1 and Cp2 capacitors and then re-apply voltage from them to the load to boost the output. Once the input signal voltage decreases below the supply voltage level, then the outer bridge is switched 'off' by the controller and the inner bridge resumes normal operation.

Note that in the above description, operation of circuit 400 begins with the charging of the capacitors such that the left hand side of CP1 and the right hand side of CP2 are at the negative supply voltage, while the right hand side of CP1 and the left hand side of CP2 are at the positive supply voltages. Thus, each is available to drive the left (CP1) or right (CP2) side of the bridge above the positive supply voltage so achieving the desired voltage doubling effect. It will be clear to those skilled in the art that the circuit operation may be such that the left hand side of CP1 and the right hand side of CP2 begin at the positive supply voltage, and the right hand side of CP1 and the left hand side of CP2 begin at the negative supply voltage, in which case the capacitors are available to drive the load terminals below the negative supply voltage. Double voltage is similarly achieved in this case because the load may be driven from positive to negative on each side, rather than from positive to double the positive voltage as described above.

It will be seen by one of skill in the art that in order for the power into the load to be increased, capacitors Cp1 and Cp2 must be of large enough capacitance to hold sufficient charge to prevent the voltage across the capacitors from discharging significantly while they are driving the load. In the case of typical class-D amplifiers running at hundreds of kHz switching rates it can be calculated that capacitor values of around 1 to 10 microfarads (uF) are large enough to perform this function well.

The needed capacitance C is approximated by using the equation I=C* the derivative of voltage over time (dv/dt), where I is the current through the Load. In the case of a loudspeaker, dv/dt might be chosen to provide for a capacitor drop of 0.1 volt in 1 microsecond, so that dv/dt is equal to $10^{-1}/10^{-6}$, or $10^5$.

If the voltage is 8 volts (as above, with a battery of 4 volts and the left side of outer bridge 404 on), and the loudspeaker Load has a resistance of 8 ohms, then the load current I will be 8 Volts/8 ohms=1 ampere. Thus, the capacitance C will be approximately $1/10^5$, which is 10 microfarads. Smaller capacitor values may be used if the voltage across the capacitor is allowed to drop more than 0.1 volt in 1 microsecond.

When the input signal is above the supply voltage, capacitors Cp1 and Cp2 will be charged up and boost the voltage to the Load, dropping their voltage slightly as they provide extra power to the Load. On subsequent switch operations capacitors Cp1 and Cp2 will be charged back to their fully charged state and then re-applied to the load as required.

As noted above, prior art solutions using charge pumps require large capacitors, with capacitance of thousands of microfarads, to provide enough power to drive the loudspeaker load to respond to an audio signal. However, there is another problem, which is the effective impedance of such capacitors.

The instantaneous impedance of a capacitor of capacitance C receiving a signal is equal to $1/2\pi fC$, where f is the frequency of the received signal. Thus, for example, the effective instantaneous impedance a one microfarad capacitor receiving a 1 kilohertz (Khz) audio signal is about 160 ohms. If a loudspeaker in series with the capacitor has a resistance of 8 ohms, most of the supply voltage will be used driving current through the capacitor, and the loudspeaker will only receive about 8/(160+8) or 1/21 of the input signal.

However, it can be seen that a higher frequency input signal will greatly reduce the effective impedance of the capacitor. Thus, the same capacitor of one microfarad receiving a 1 megahertz (Mhz) signal, which is a frequency 1000 times greater than 1 Khz, will thus have an effective capacitance 1000 times less, or about 0.16 ohms. Placing such a small impedance in series with a loudspeaker having a resistance of 8 ohms will allow the loudspeaker to receive 8/(8+0.16), or about 98%, of the input signal.

It is in large part the fact that the capacitors may be as small as a few microfarads that allows for their use in a portable device, unlike the prior art solutions described above. Those of skill in the art may be surprised that such small capacitors will suffice to generate the increased voltage in a dual bridge circuit as explained above, but, as above, the small size of capacitors Cp1 and Cp2 is possible because the capacitors do not receive a signal at the audio frequency, but rather only at the much faster switching frequency of the FETs, which acts as a "carrier" frequency for the audio signal.

Figure 5:
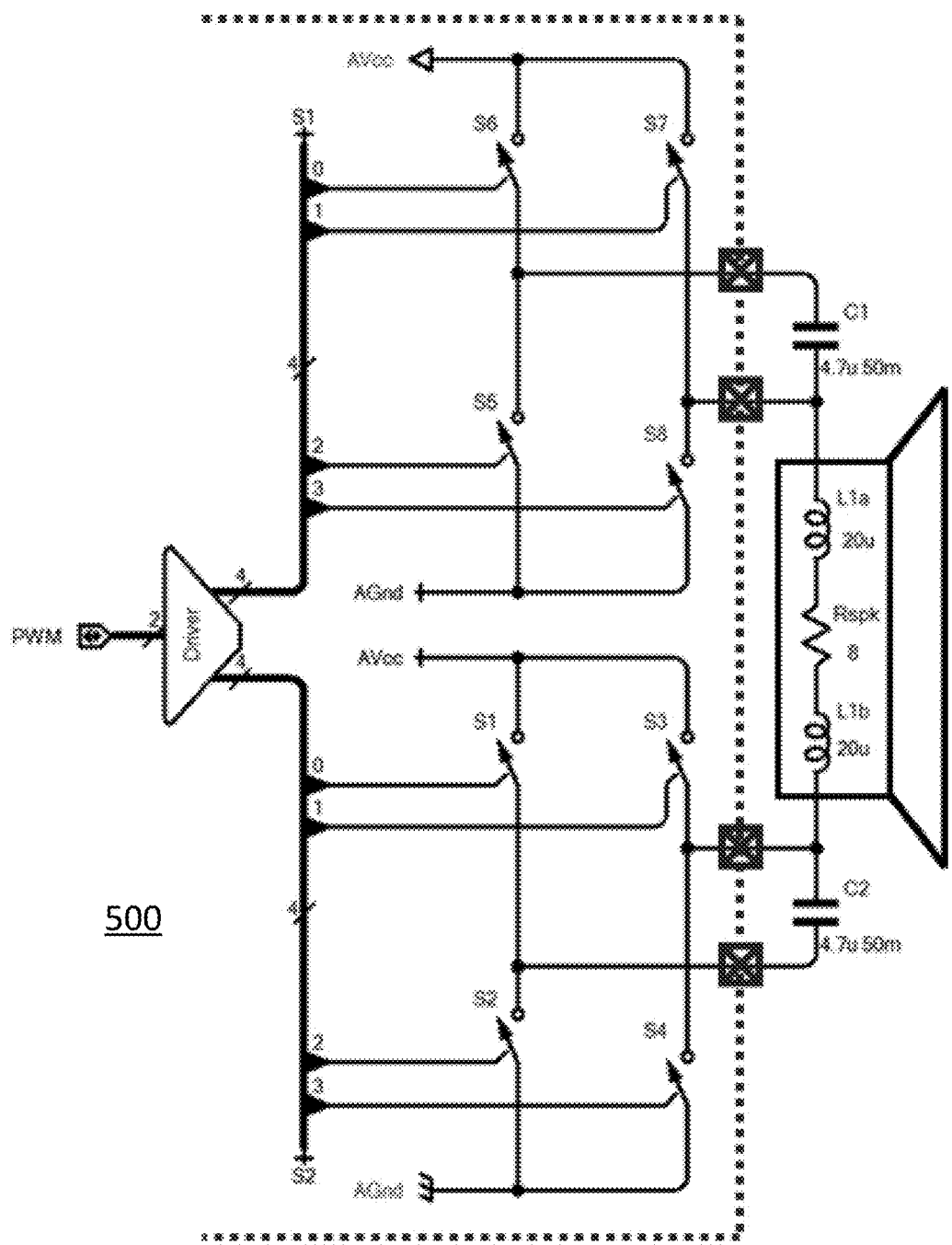
FIG. 5 is an illustration of an idealized circuit for simulating one embodiment with the voltage boosted to two times the supply voltage.
Figure 6A:
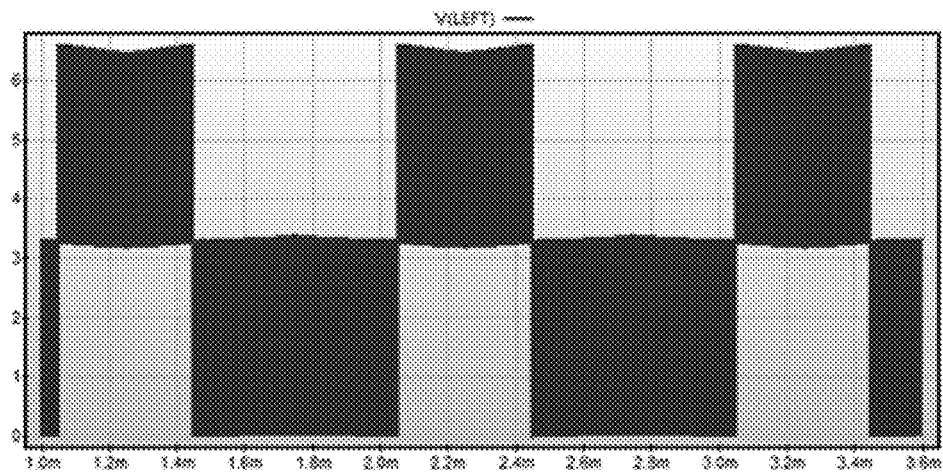
FIGS. 6a, 6b and 7 are graphs of the result of a simulation of one embodiment using the idealized circuit of FIG. 5.
Figure 6B:
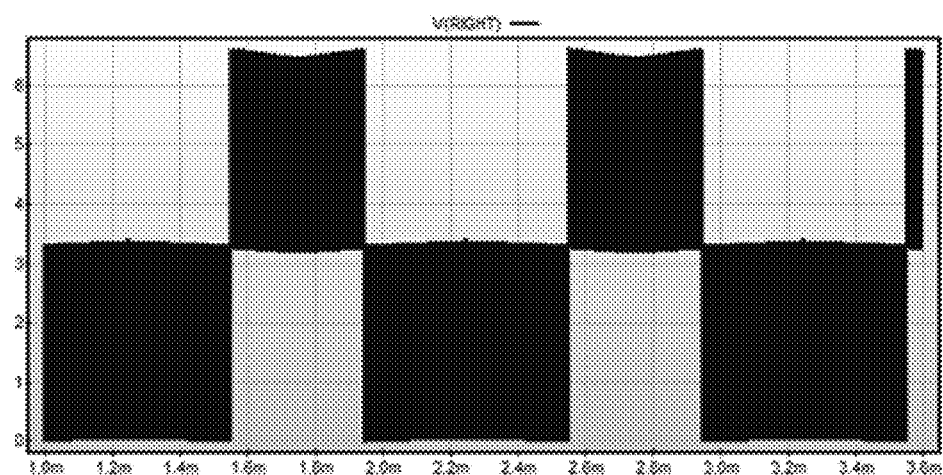

FIGS. 5, 6a and 6b show a simulation of one embodiment with the voltage applied to the load boosted to two times the supply voltage. The circuit 500 of the simulation is shown in FIG. 5 and uses ideal switches S1 to S8 rather than FETs, with S1, S3 S5 and S8 corresponding to the inner bridge 402, and S2, S4, S6 and S7 corresponding to the outer bridge 404 of FIG. 4. Capacitors C1 and C2, AVcc and AGnd, and Rspk in FIG. 5 correspond to capacitors Cp1 and Cp2, the positive and negative voltage supply, and Load in FIG. 4, respectively.

The waveforms of FIGS. 6a and 6b show one result of the simulation, the voltages at opposite ends of the load, respectively. The signal designated 'Left' in FIG. 6a is the voltage on the load at the end by capacitor C1, and the signal designated 'Right' in FIG. 6b is the voltage at the end of the load by capacitor C2. When the inner bridge operates the voltages transition from 0 to 3.3V, while when the outer bridge operates the voltages transition from 3.3 to 6.6V, thus increasing the power to the load.

In an actual circuit implementation negative feedback may be taken from the output of the amplifier back to the inputs of a class-D controller circuit. By such means any non-linearities introduced by the output stages might be suppressed so that the overall distortion behavior of the amplifier may be improved.

Figure 7:
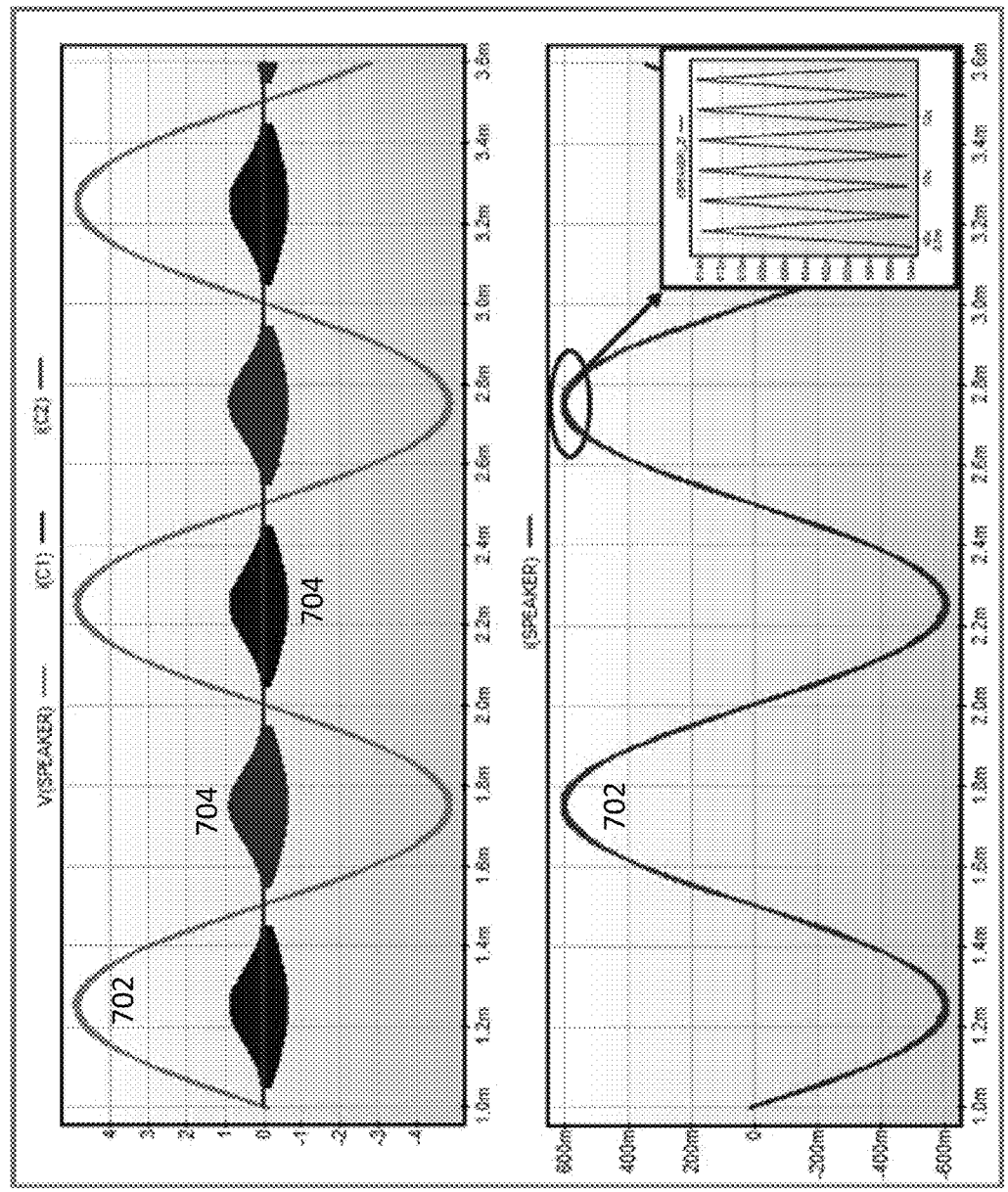

FIG. 7 shows graphs of waveforms for the currents through the capacitors C1 and C2 and the load in the circuit simulation of FIG. 5. The sinusoid waveforms 702 are the currents in the load that are the 'average' signal currents and can be transformed into the voltage waveform when current is multiplied by the load resistance. The smaller waveforms 704 in the upper plot of FIG. 7 are the currents in the Cp1 and Cp2 capacitors. The inset in the lower plot of FIG. 7 shows the 'ripple' current in the load from the class-D switching.

In circuit 400 of FIG. 4 above, the voltage applied to the Load is increased by using the capacitors to drive the positive voltage applied to both sides of the Load above the level of the positive supply voltage. One of skill in the art will appreciate that the polarity of the capacitors may be reversed, so that the voltage applied to the Load is increased by using the capacitors to drive the negative voltage applied to both sides of the Load below the level of the negative supply voltage. This will also double the voltage applied to the Load to double the supply voltage.

One of skill in the art will also appreciate that if the voltage to the Load can be driven to provide both a positive voltage to the Load that is above the positive supply voltage, as well as a negative voltage to the Load that is below the negative supply voltage, then the voltage applied to the load can be tripled, rather than merely doubled as in circuit 400.

In theory, this can be done using the circuit 400 of FIG. 4 by charging capacitors Cp1 and Cp2 so as to increase the voltage applied to the Load above the positive voltage supply each time the input signal warrants such a voltage, and in the opposite direction when the input signal warrants a voltage below the negative voltage supply. However, the ability to drive the Load both above and below the supply voltages is both more inefficient and more expensive than either one alone.

Driving the voltage of the capacitors from above the positive supply voltage to below the negative supply voltage (or vice versa) requires removing all of the charge from the capacitors and then charging them to the opposite polarity, a very inefficient use of power. Further, such a change would require that the capacitors be bi-polar, such as more expensive non-electrolytic capacitors, rather than electrolytic capacitors which are only polar. The use of polar electrolytic capacitors, while limiting the way in which the capacitors contribute to the voltage across the load, is thus simpler and cheaper.

One way to accomplish increased voltages both above the positive voltage supply and below the negative voltage supply with two capacitors would be to use additional switches to connect the capacitors "in the opposite direction" when needed, but due to the number of switches needed this would require significant additional complexity and cost.

Figure 8:
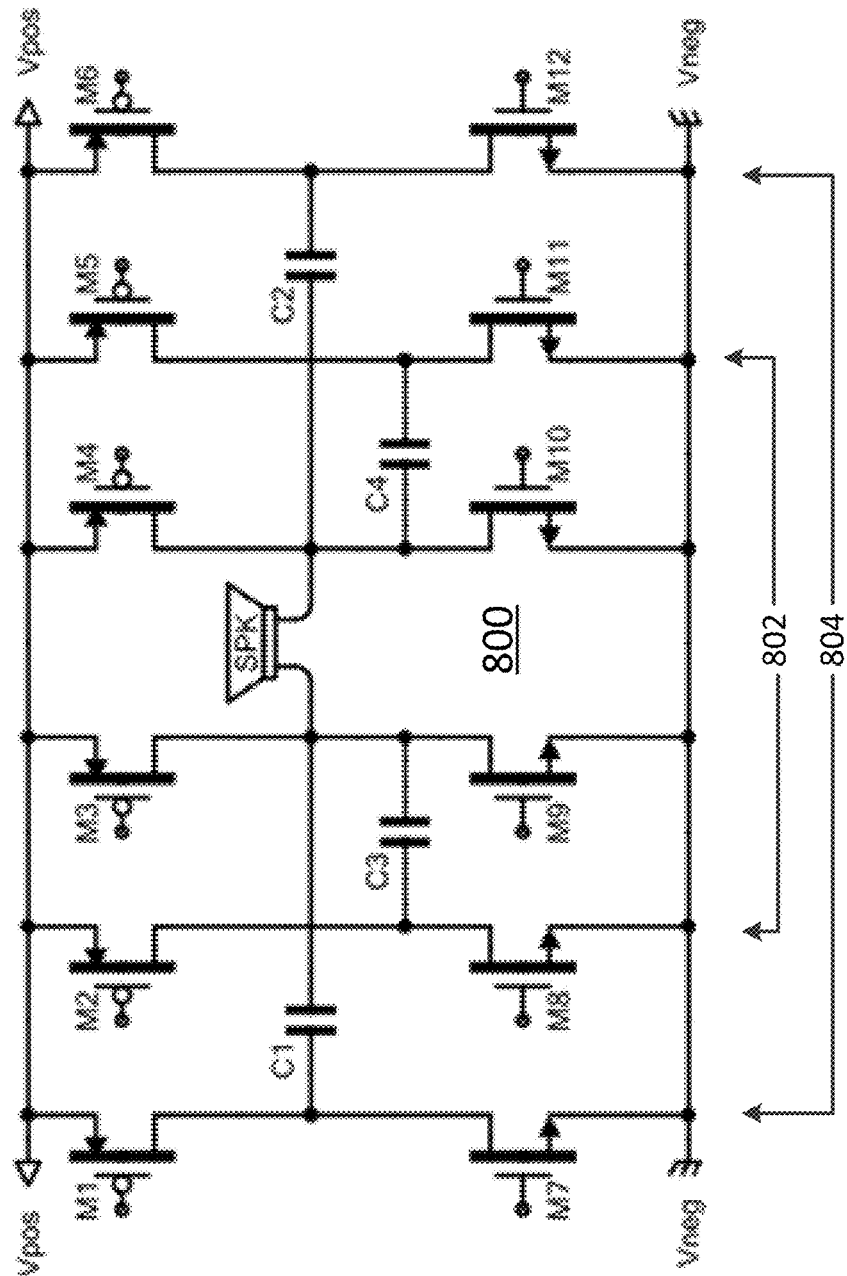
FIG. 8 is an illustration of an amplifier having three bridges according to one embodiment.

A different solution is to use a second outer bridge, and another pair of capacitors. FIG. 8 shows such a circuit 800 in which a second outer bridge and two additional capacitors are added to the circuit 400 of FIG. 4.

The first outer bridge 802 in circuit 800 consists of FETs M2, M5, M8 and M11. It is operated such that M3 and M8 are on at the same time to charge capacitor C3, and M4 and M11 are on at the same time to charge capacitor C4. As in circuit 400 of FIG. 4 above, the positive ends of capacitors C3 and C4 are connected to the load (here loudspeaker SPK). Thus, capacitors C3 and C4 are available to push the voltage to the load SPK higher than the positive voltage supply (Vpos in FIG. 8). This is the same operation as explained with respect to circuit 400 in FIG. 4 above, and results in an increase in the voltage to the load equal to supply voltage, resulting in an output voltage to the load of double the supply voltage.

In addition to the first outer bridge 802 in circuit 800, there is a second outer bridge 804, consisting of FETs M1, M6, M7 and M12, and capacitors C1 and C2. This second outer bridge 804 is operated such that M1 and M9 are on at the same time to charge capacitor C1, and M10 and M6 are on at the same time to charge capacitor C2. Unlike capacitors C3 and C4, the negative ends of capacitors C1 and C2 are connected to the load SPK. Thus, capacitors C1 and C2 are available to push the voltage to the load SPK lower than the negative voltage supply (Vneg in FIG. 8), rather than pushing the output higher than the positive voltage supply as did capacitors C3 and C4. This results in another increase in the voltage to the load equal to the supply voltage. Thus, if both outer bridges 802 and 804 are operating, the output voltage to the load will be equal to triple the supply voltage.

Unlike circuit 400 of FIG. 4, there is now no need to reverse the polarity of capacitors C3 and C4 (Cp1 and Cp2 in FIG. 4) in order to push the voltage to the load lower than the negative voltage supply. The circuit 800 of FIG. 8 thus remains efficient, and the voltage that may be output to the load has a range equal to three times the power supply voltage.

It will be appreciated that in a Class-D amplifier using such a "triple-voltage" "second (or double) outer bridge" "double capacitor boost" circuit, some efficiency will be lost in the drivers that are needed to turn the FET switches on and off, because the gate capacitances are typically high (in order to get low on-resistances). It is possible, however, to reduce such inefficiency.

Consider the operation of circuit 800 of FIG. 8 as described above by reference to Table 1, a table of FET switches, where the M numbers are those of the FETs of FIG. 8:

TABLE 1

| State | M1 | M2 | M3 | M4 | M5 | M6 | M7 | M8 | M9 | M10 | M11 | M12 |
|---|---|---|---|---|---|---|---|---|---|---|---|---|
| ++ |  | ON |  |  |  |  |  |  |  |  |  | ON |
| + |  |  | ON |  |  | ON |  | ON |  | ON |  |  |
| − | ON |  |  | ON |  |  |  |  |  | ON |  | ON |
| −− |  |  |  |  |  | ON |  | ON |  |  |  |  |

In Table 1 a ++ entry means output an output voltage to the load that is greater than the positive voltage supply on the left side of the bridge and lower than the negative voltage supply on the right side of the bridge. A + entry means an output equal to the positive voltage supply on the left and to the negative voltage supply on the right, while a − entry means an output equal to the negative voltage supply on the left and to the positive voltage supply on the right. Finally, a −− entry means an output lower than the negative voltage supply on the left and higher than the positive voltage supply on the right.

As shown, four FET switches are closed during the + and − states. For example, in the + state FETs M3 and M10 are on to create the requested output voltages, but M8 is also on so that M3 charges up capacitor C3 at this time, and M6 is also on so that M10 charges up capacitor C4 at the same time. A similar situation is present in the − state where M1 is also on to charge capacitor C1 through M9 and M11 is on to charge capacitor C4 through M4.

Thus, as the amplifier oscillates between the + and − states, as it does for low signal levels, the gates of FETs M1, M6, M8 and M11 are driven so as to keep all four capacitors in a state where they can be called upon to drive above or below the power supply when needed.

However, there is an unnecessary inefficiency here, as there is no need to keep turning on FETs M1, M6, M8 and M11 once the capacitors are charged. Rather, since the controller has access to the analog signal it is delivering to the load, the controller can detect that the analog signal is approaching the point where these capacitors will be needed. Such detection is sufficient to begin the process of driving FETs M1, M6, M8 and M11.

In the case of low input signal levels, all of FETs M1, M6, M8 and M11 can remain inactive since no boosted supply voltage is needed and the capacitors need not be charged. This saves the current that would otherwise be used to charge and discharge the gates of FETs M1, M6, M8 and M11. However, in the case of larger input signals, the capacitors are still needed, and thus the appropriate FETs must be active as described above in the absence of a better solution. The controller determines when each of the FETs is active, and may be programmed to turn them on and off to save current in this way. As discussed below, the controller may use a lookup table to determine which FETs should be active in a given situation.

Figure 9:
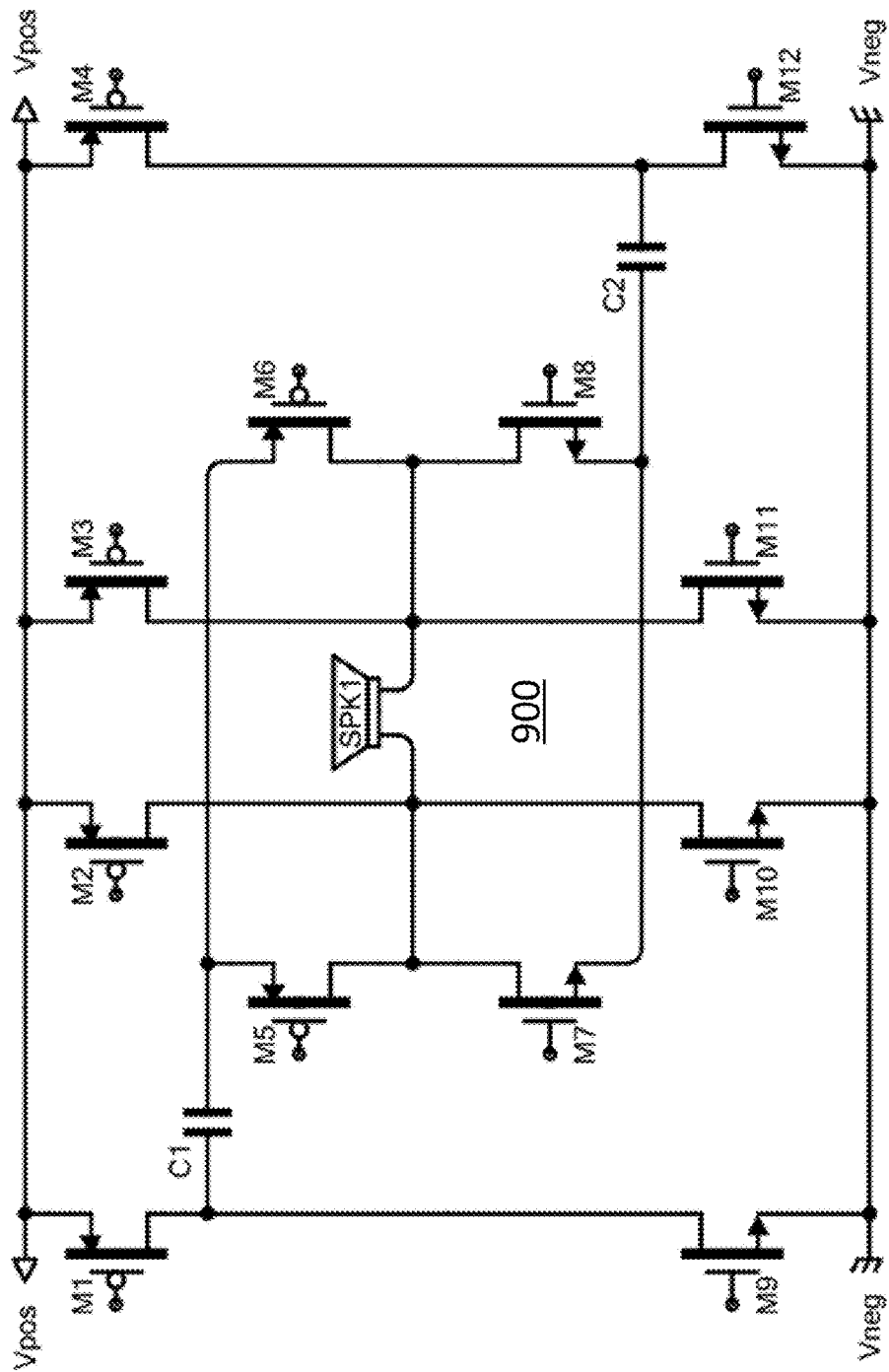
FIG. 9 is an illustration of an amplifier able to achieve the performance of the amplifier of FIG. 8 with fewer capacitors.

An alternative solution to circuit 800 of FIG. 8 is shown in FIG. 9. Circuit 900 shows a way in which the desired result of pushing both sides of the load SPK1 both up and down from the supply voltage, as in circuit 800 above, can be achieved using only two capacitors rather then the four capacitors used in circuit 800. This is accomplished by alternately connecting the capacitors to either side of SPK1 as needed, rather than to only one side as in circuit 800. Circuit 900 has the same two capacitors as, but four more FET switches than, the full bridge circuit 400 of FIG. 4.

In circuit 900, capacitor C1 is located so that it is charged via FET M9 and by one of two other connections, either via M5 and M2, or via M6 and M3. In both cases the left hand side of C1 is charged to Vneg (the negative voltage supply), and the right hand side to Vpos (the positive voltage supply). When higher voltage is needed to boost the left hand side of SPK1 above the positive voltage supply, M1 and M5 are on, connecting capacitor C1 to the left hand side of SPK1, while when higher voltage is needed to boost the right hand side of SPK1, M1 and M6 are on, connecting capacitor C1 to the right hand side of SPK1. Consequently, capacitor C1 is able to push the voltage applied to either the left or the right side of SPK1 above the positive voltage supply.

Similarly, capacitor C2 is located so that it is charged via M4 and by one of two other connections, either via M8 and M11, or via M7 and M10. In both cases the left hand side of C2 is charged to Vneg (the negative voltage supply) and the right hand side to Vpos (the positive voltage supply). When lower voltage is needed to push the left hand side of SPK1 below the negative supply, M12 and M7 are on, connecting capacitor C2 to the left hand side of SPK1, while when lower voltage is needed to push the right hand side of the speaker below the negative voltage supply M12 and M11 are on. Consequently, in a similar fashion to capacitor C1 increasing the supply voltage, capacitor C2 is able to push the supply voltage applied to either the left or right hand side of SPK 1 below the negative voltage supply.

With only two capacitors, circuit 900 is thus able to apply voltages either higher than the positive voltage supply or lower than the negative voltage supply to either side of the load. One disadvantage of circuit 900 relative to the four-capacitor circuit 400 is that in circuit 900 in some situations more FET switches are on in series than in circuit 400, which increases the apparent resistance. These situations occur during re-charge, when three FET switches in circuit 900 in series form the re-charge path (as compared to two in the four-capacitor circuit), and when the circuit is called upon to apply voltage either above or below the supply voltages, when two FET switches are on in series (as compared to one, in the four capacitor circuit). Consequently, there is a slight reduction in efficiency because more FETs are on part of the time in circuit 900.

There is yet another advantage to the two capacitor configuration of circuit 900. Referring back to circuit 800 in FIG. 8, the devices M1 and M7 on the left hand side of circuit 800 are on when charging capacitor C1. Because the right hand side of capacitor C1 sees whatever signal is presented to the left hand terminal of SPK and cannot be disconnected from it, it is necessary to turn off both M1 and M7 to allow the left hand side of C1 to exceed the positive supply. (Recall that capacitors C1 and C2 in the second outer bridge 804 are enabling a drive below the negative voltage supply, and thus the left hand side of C1 is pumped up above the positive voltage supply when M3 is on; thus, at this time M1 must be off allowing the left hand side of C1 to go above the positive supply without clamping.)

To drive a capacitor above the positive supply voltage (or below the negative supply voltage) requires that the FET switches driving the capacitors be designed to tolerate voltages outside the power supply value. However, referring again to FIG. 9, in the two-capacitor circuit 900, the drivers M1 and M9, and M4 and M12 need never both be off and need not tolerate voltages outside the power supply voltages. This simplifies the driving electronics, i.e., the devices driving the gate of these FETS, and it removes the need to have floating diffusion regions that would otherwise be required to accommodate higher voltages. (This is true at least in the case of FETs M1, M4, M9 and M12. The other six FET devices will still require protection and accommodation of voltages outside the power supply rails).

One of skill in the art will also appreciate that circuit 900 is as efficient as circuit 800 of FIG. 8 with respect to power consumption by the FET switches. Recall Table 1 above, which indicates the state of the FET switches for each possible situation of applied voltage to the load for circuit 800 of FIG. 8. The efficiency of circuit 800 to that of circuit 900 may be made by noting the number of FET switch transitions (from on to off or vice versa) for each voltage state transition:

| State transition | Circuit 800 - Four capacitor | Circuit 900 - Two Capacitor |
|---|---|---|
| ++ to + | 6 | 6 |
| + to − | 8 | 8 |
| − to −− | 6 | 6 |

As above, a + entry means an output equal to the positive voltage supply on the left and to the negative voltage supply on the right, a − entry means an output equal to the negative voltage supply on the left and to the positive voltage supply on the right, a ++ entry means an output higher than the positive voltage supply on the left and lower than the negative voltage supply on the right, and a −− entry means an output lower than the negative voltage supply on the left and higher than the positive voltage supply on the right.

There is no difference in the number of FET transitions needed to accomplish a voltage state transition, and so from the point of view of a gate charge loss, the designs of circuit 800 and circuit 900 are equally efficient. The efficiency of the two-capacitor circuit 900 can also be improved by leaving FETs M5, M6, M7 and M8 off when the analog signal is small. This provides the same efficiency improvement as in the four-capacitor circuit. The circuits are therefore equivalent in this regard as well.

As explained above, a controller is required to turn the FET switches of any of the described circuits on and off as appropriate for a received input signal. While any typical class-D controller may be used, one example of such a controller is shown in circuit 1000 of FIG. 10.

A triangle waveform is generated by known means, shown here as a clock C applied to an integrator made up of an opamp U1, resistor R1 and capacitor C5, such that the clock amplitude spans the voltage difference between comparison voltages rl ("reference low") and rz ("reference zero"), and between rz and rh ("reference high"). For example, rh may be +1 volt, rz may be 0 volts and rl may be −1 volt, in which case the triangle amplitude is also 1 volt. As the triangle waveform crosses these thresholds the comparators CH, CZ and CL drive the primary (or "basis") state variables of the decoder ("DECODE").

The decoder translates the primary state variables into the particular states necessary to drive the switches. The states are arranged sequentially in the output voltage that they generate, and, because the triangle wave has a frequency of operation, the output voltages may be filtered to derive an average output voltage. This average output voltage across the speaker is available via U5, a differencing element, that creates the "speaker signal" to be fed to a finite bandwidth analog control loop exemplified by U4 and band limiting capacitor C6.

The band limited, and thus average, output is compared against the triangle waveform and affects the probability of the appearance of the particular primary states of the comparators, which in turn affect the average output as a consequence of the decoder. Since the output states are monotonic in voltage, an overall negative feedback can be stable and, within a specific low bandwidth, typically the audio range of about 10 Hz to 20 KHz, the average output voltage is made equal to the input voltage.

One of skill in the art will appreciate that the two additional comparators CC− and CC+ do not affect the output voltage of the bridge, but they do affect the re-charge of the capacitors. These comparators CC− and CC+ have thresholds that set limits within which the recharge is inactive. They constitute the mechanism that turns off the drivers in appropriate circumstances as mentioned above.

The controller 1000 is but one example of a controller based on the principle of an out-of-band modulation being applied to a control loop. Changing the bridge configuration from four to two capacitors as is described above does not change the basic design of this control loop, but does require consideration of the fact that the switches are connected in different ways depending upon which configuration is used. Thus, it is required that the mapping of the various control signals present in the decode block, which may, for example, be stored as a table, be changed to correspond to the circuit configuration.

In some embodiments, it may be possible to dynamically configure such a table depending upon the current function of the mobile device. For example, if the operating software of a smartphone detects that a telephone call is in progress, it might provide a table to the amplifier controller preventing the outer bridge(s) from even being activated and then, when music is being played, provide a table that allows the amplifier controller to again activate them. A smartphone or other mobile device might also disable the use double or triple voltage operation when a low battery is detected, to delay the device running out of power.

Figure 10:
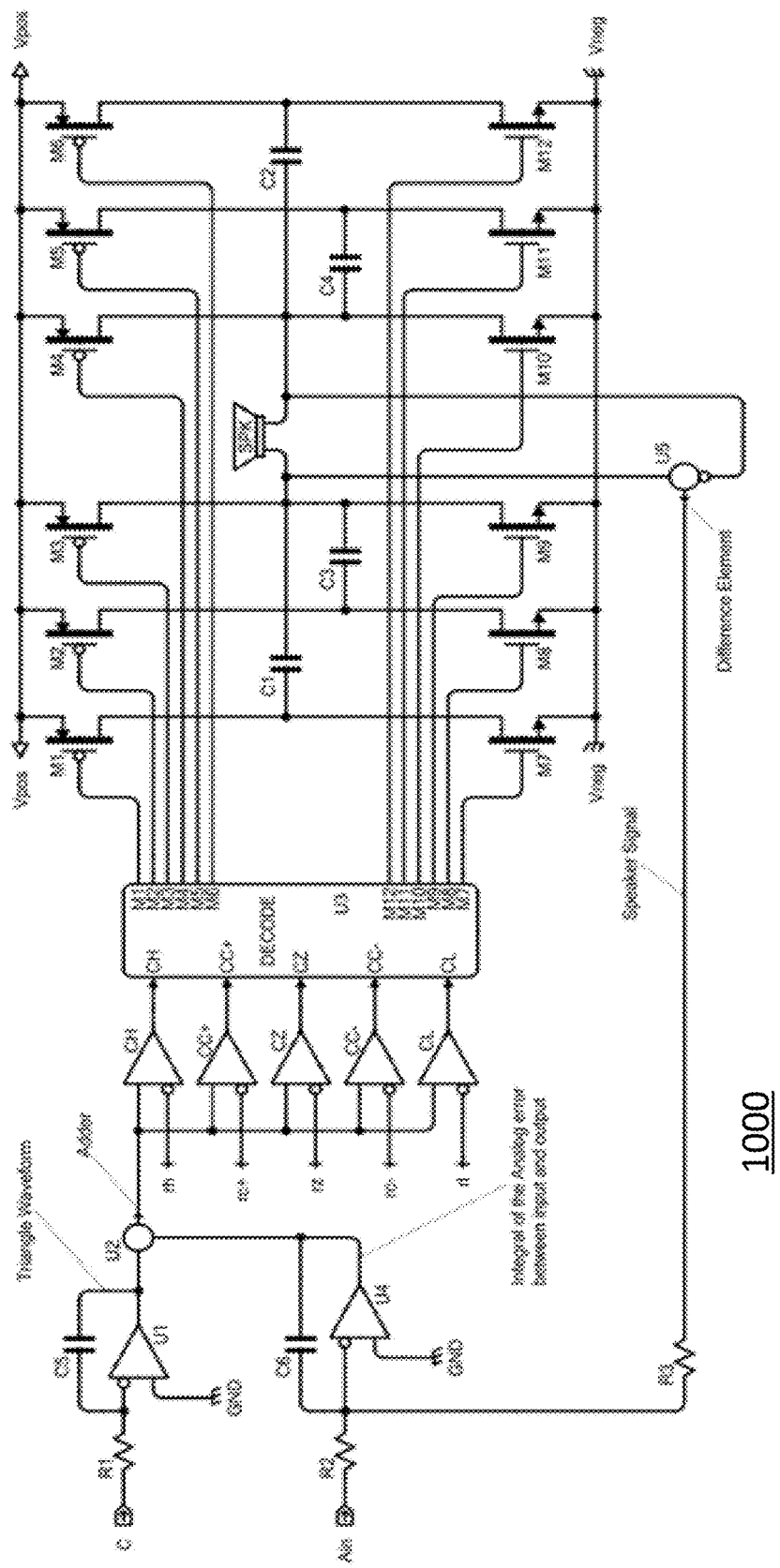
FIG. 10 is an example of a controller for a class-D amplifier.
Figure 11:
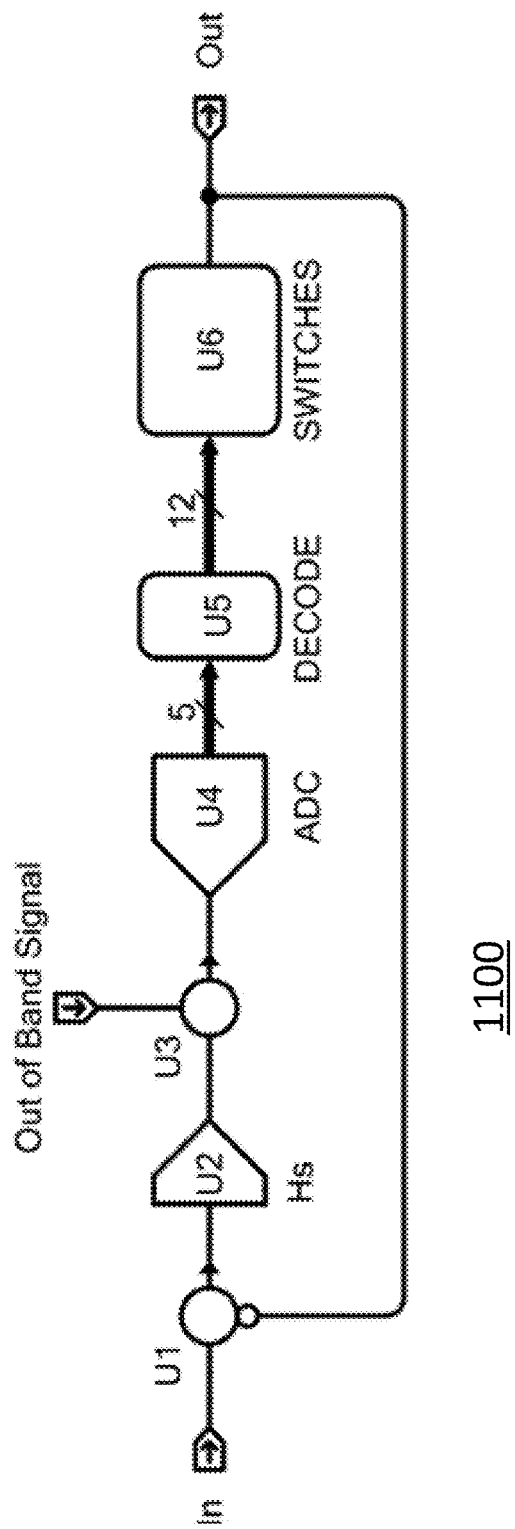
FIGS. 11 and 12 are block diagrams of generic control loops for a class-D amplifier as in the prior art.

FIG. 11 shows a generic controller of which FIG. 10 is an example. In circuit 1100, U1 is the difference element that compares the output signal "Out" to the input signal "In" and drives an error signal into U2, the filter element. The filter element U2 is essentially an integrator, although it can be of arbitrary complexity, that accumulates the error in a certain bandwidth, and applies it to U3, an adder that adds a perturbation, a signal outside the band of interest, to the integrated error.

U4 is shown here as an analog to digital converter (ADC), in general a quantizer, that accepts the perturbed integral signal as an input and generates a sequence of states expressed on the bus (shown as "5" in FIG. 11, although the bus can be of arbitrary width). The discrete set of states output from the ADC or quantizer are applied to element U5, a decoder, which as above may be a "look up table" that translates the ADC or quantizer states into switch control states (shown as the bus "12" in FIG. 11, although again the bus can be arbitrary width).

It is necessary that the sequence of adjacent states generated by the ADC or quantizer U4 result in switch control states that are monotonic in output. That is to say, as the input to the ADC or quantizer sweeps over its input range, the switch driver states cause the output parameter to move monotonically up or down in output. Whether the sequence of output states is increasing "up" or decreasing "down" determines the polarity of the feedback. As shown in FIG. 11, as the ADC input increases the switches must be driven to monotonically increase the output, since the feedback to U1 is shown as negative (i.e., the "bubble" on the lower part of U1 indicates a subtraction).

Figure 12:
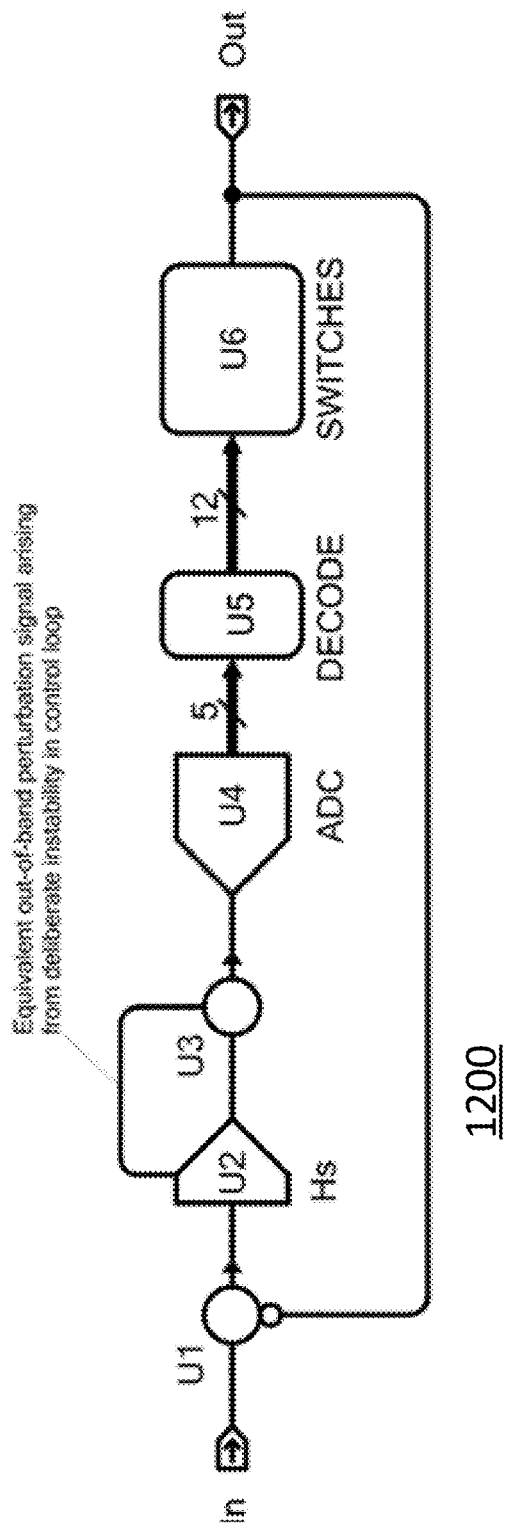

FIG. 12 shows a variation of the generic control loop of FIG. 11. In the control loop circuit 1200 of FIG. 12, as is known in the art the out-of-band signal arises from a deliberate instability in the control loop so that the circuit is self-oscillating; notwithstanding this difference from control loop circuit 1100, the same generic description of the control loop above applies. The double or triple voltage circuits described herein can similarly be self-oscillating.

Figure 13:
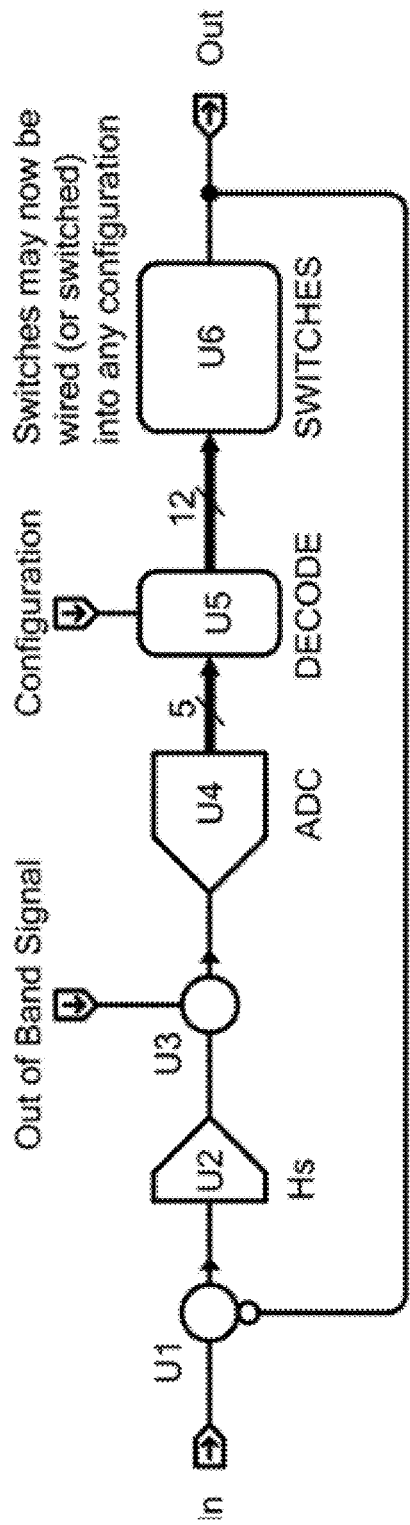
FIG. 13 is a block diagram of an alternative generic control loop for a class-D amplifier according to one embodiment.

FIG. 13 shows a control loop circuit 1300 according to one embodiment in which the decoder U5 receives a desired configuration. It will be seen by those of skill in the art that any configuration of switches that meets the requirement of monotonic output for transitions between adjacent states of the quantizer output may be controlled by the same loop. The different switch configurations are accommodated by the configuration received by the decode block U5. The changes may be hard-wired to a particular switch configuration, or, the system may adapt to different switch configurations as instructed by the input signal(s) "Configuration" to the decoder element.

Figure 14:
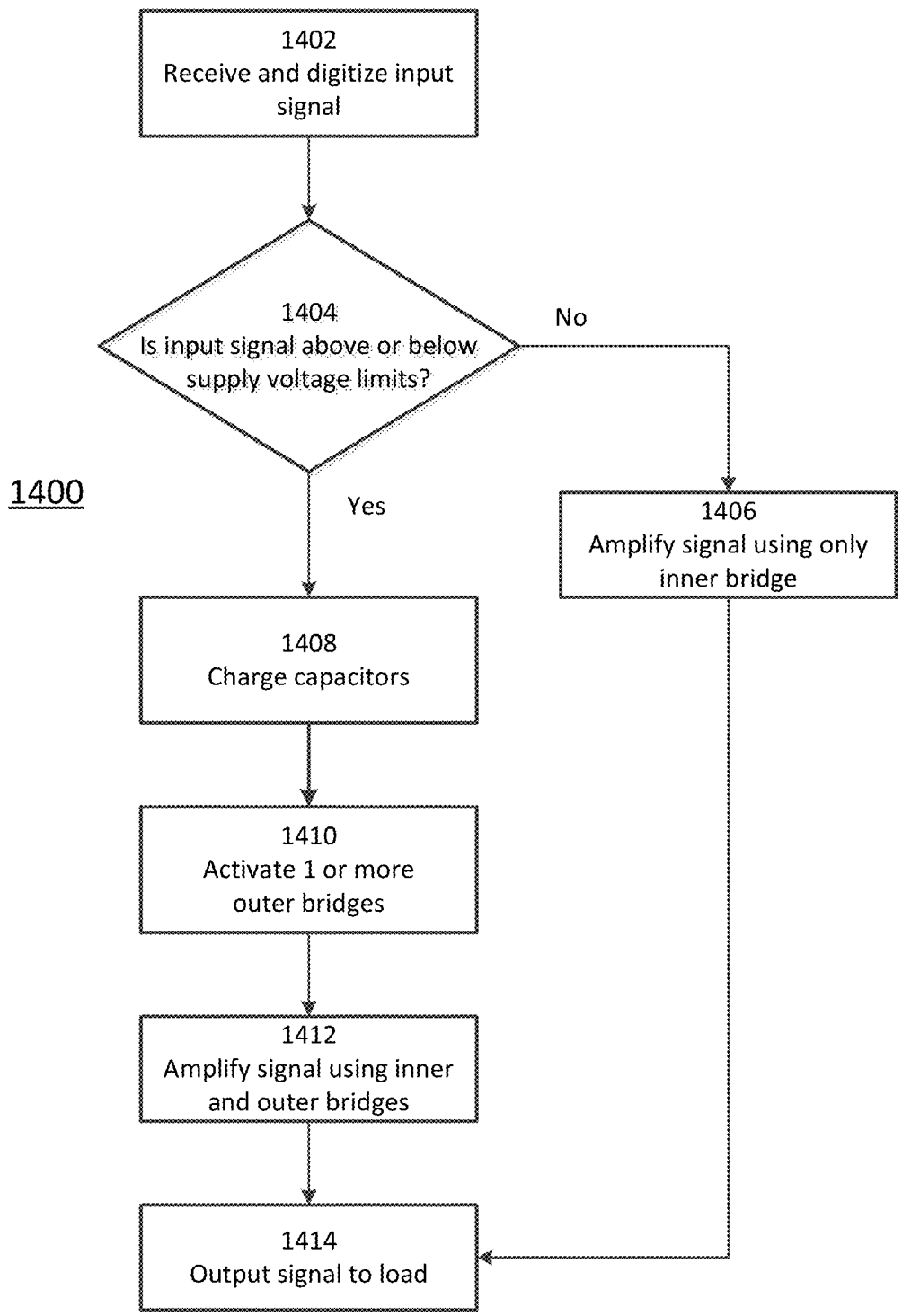
FIG. 14 is a flowchart of one embodiment of a method of using a class-D amplifier circuit that is configured as, or similar to, one of those described herein.

FIG. 14 is a flowchart of one embodiment of a general method 1400 of using a class-D amplifier circuit that is configured as, or similar to, one of those described above. The method 1400 assumes that the class-D amplifier circuit has at least one outer bridge in addition to the conventional inner bridge commonly used in the prior art.

At step 1402, the amplifier receives and digitizes an input signal. As above, if the load on the amplifier is a loudspeaker, this is expected to be an audio signal that is to be amplified and played through the loudspeaker. The audio signal is digitized as known in the art, for example, by combining it with a triangle waveform as shown in circuit 1000 of FIG. 10.

At step 1404, a controller, such as circuit 1000 of FIG. 10, determines whether the input signal extends above the upper limit of, or below the lower limit of, the supply voltage.

If the input signal does not extend above or below the limits of the supply voltage, then as above only the conventional inner bridge is needed to amplify the signal. At step 1406, the controller generates the appropriate codes to open or close switches in the amplifier circuit (which as above may, for example, be FETs), as explained above, so that the outer bridge(s) do not contribute to the voltage to the load and the input signal is amplified using only the inner bridge. As described above, the codes may be contained in a lookup table accessed by the controller.

If, however, the signal extends above or below the limits of the supply voltage, then one or more of the outer bridges (again, the method assumes there is at least one, and there may be more as described above) is then used to obtain the appropriate higher and/or lower voltage to the load.

In this case, at step 1408 the controller causes the capacitors in the circuit to be charged, and at step 1410 the controller activates one or more of the outer bridges by generating the appropriate codes to open or close the switches that cause one or more capacitors to contribute to the voltage applied to the load. At step 1412 the input signal is then amplified using both the inner bridge and the activated outer bridge(s) as described above.

After the input signal has been amplified either by the inner bridge alone at step 1406, or by the inner and outer bridge(s), the amplified signal is output to the load at step 1414.

Some modification of the order of steps is possible. For example, as described above, in some embodiments the capacitors may always be charged and the connection to the load not activated unless the capacitors are needed to contribute to the voltage applied to the load, while in other embodiments the capacitors are only charged when it is anticipated that such contribution to the voltage to the load will be needed. One of skill in the art will appreciate other modifications to the described method.

The disclosed system and method has been explained above with reference to several embodiments. Other embodiments will be apparent to those skilled in the art in light of this disclosure. Certain aspects of the described method and apparatus may readily be implemented using configurations or steps other than those described in the embodiments above, or in conjunction with elements other than or in addition to those described above.

For example, it is expected that the described apparatus may be implemented in numerous ways, including as a hard-wired circuit or embodied in a semiconductor device. The switches may be FETs as described, including, but not limited to MOSFETs, or may be other types of switches.

Where elements are shown as connected, they may in some embodiments be coupled to each other through another element, for example, through another resistor. Different supply voltages may be used for particular applications, loads other than loudspeakers and of various resistances may be used, and various parameters for other components, such as the capacitors, may be used depending on the particular application. One of skill in the art will appreciate how to determine what component values will be appropriate for a specific intended application.

In addition, depending on the signal magnitude and amplifier scheme preferred, it can be chosen to boost either or both ends of the signal to the load, above or below the supply levels, so achieving a 'multi-level' drive signal These and other variations upon the embodiments are intended to be covered by the present disclosure, which is limited only by the appended claims.

What is claimed is:

1. A class-D amplifier for providing a series of output pulses to a load, the output pulses representing an input signal, comprising:
    six half bridge switching circuits, each half bridge switching circuit having a first transistor and a second transistor, the gate of each first and second transistor receiving a series of input pulses representing the input signal, the source of each first transistor coupled to a positive power supply, the source of each second transistor coupled to a negative power supply, and the drain of the first transistor in each half bridge connected to the drain of the second transistor in the same half bridge;
    the drains of both transistors of a first half bridge switching circuit connected to one side of the load and the drains of both transistors of a second half bridge switching circuit connected to the opposite side of the load;
    a first capacitor having a positive terminal connected to the drains of both transistors of the first half bridge and a negative terminal connected to the drains of both transistors of a third half bridge;
    a second capacitor having a positive terminal connected to the drains of both transistors of the second half bridge and a negative terminal connected to the drains of the transistors of a fourth half bridge;
    a third capacitor having a negative terminal connected to the drains of both transistors of the first half bridge and a positive terminal connected to the drains of both transistors of a fifth half bridge; and
    a fourth capacitor having a negative terminal connected to the drains of both transistors of the second half bridge and a positive terminal connected to the drains of the transistors of a sixth half bridge.

2. The class-D amplifier of claim 1, wherein each first transistor is a PMOS transistor.

3. The class-D amplifier of claim 2, wherein each second transistor is an NMOS transistor.

4. The class-D amplifier of claim 1, wherein each second transistor is an NMOS transistor.

5. The class-D amplifier of claim 1 further comprising a digitizer circuit having an input for receiving an input signal and generating a series of input pulses representative of the amplitude and frequency of the input signal to be applied to the gates of the first and second transistors, the series of input pulses having a frequency substantially higher than the frequency of the input signal.

6. The class-D amplifier of claim 5 wherein the input signal is an audio signal and the load is a loudspeaker.

7. A class-D amplifier for providing a series of output pulses to a load, the output pulses representing an input signal, comprising:
    four half bridge switching circuits comprised of eight transistors, each half bridge switching circuit having a first transistor and a second transistor, the gate of each first and second transistor receiving a series of input pulses representing the input signal, the source of each first transistor coupled to a positive power supply, the source of each second transistor coupled to a negative power supply, and the drain of the first transistor in each half bridge connected to the drain of the second transistor in the same half bridge;

the drains of both transistors of a first half bridge switching circuit connected to one side of the load and the drains of both transistors of a second half bridge switching circuit connected to the opposite side of the load;

a first capacitor having a negative terminal connected to the drains of both transistors of a third half bridge;

a second capacitor having a positive terminal connected to the drains of both transistors of a fourth half bridge;

ninth and tenth transistors, the sources of the ninth and tenth transistors connected to the positive terminal of the first capacitor, the drain of the ninth transistor connected to the drains of both transistors of the first half bridge switching circuit and the drain of the tenth transistor connected to the drains of both transistors of the second half bridge switching circuit; and eleventh and twelfth transistors, the sources of the eleventh and twelfth transistors connected to the negative terminal of the second capacitor, the drain of the eleventh transistor connected to the drains of both transistors of the first half bridge switching circuit and the drain of the twelfth transistor connected to the drains of both transistors of the second half bridge switching circuit.

8. The class-D amplifier of claim 7, wherein each first transistor is a PMOS transistor.

9. The class-D amplifier of claim 8, wherein each second transistor is an NMOS transistor.

10. The class-D amplifier of claim 7, wherein each second transistor is an NMOS transistor.

11. The class-D amplifier of claim 7 further comprising a digitizer circuit having an input for receiving an input signal and generating a series of input pulses representative of the amplitude and frequency of the input signal to be applied to the gates of the first and second transistors, the series of input pulses having a frequency substantially higher than the frequency of the input signal.

12. The class-D amplifier of claim 11 wherein the input signal is an audio signal and the load is a loudspeaker.

13. A method of operating a class-D amplifier to provide a series of amplified output pulses to a load, the output pulses representing an input signal, wherein the class-D amplifier comprises six half bridge switching circuits, each half bridge switching circuit having a first transistor and a second transistor, the gate of each first and second transistor receiving a digitized input audio signal, the source of each first transistor coupled to a positive power supply voltage, the source of each second transistor coupled to a negative power supply voltage, and the drain of the first transistor in each half bridge connected to the drain of the second transistor in the same half bridge, the drains of both transistors of a first half bridge switching circuit connected to one side of the load and the drains of both transistors of a second half bridge switching circuit connected to opposite sides of the load, a first capacitor having a positive terminal connected to the drains of both transistors of the first half bridge and a negative terminal connected to the drains of both transistors of a third half bridge; a second capacitor having a positive terminal connected to the drains of both transistors of the second half bridge and a negative terminal connected to the drains of the transistors of a fourth half bridge, a third capacitor having a negative terminal connected to the drains of both transistors of the first half bridge and a positive terminal connected to the drains of both transistors of a fifth half bridge, and a fourth capacitor having a negative terminal connected to the drains of both transistors of the second half bridge and a positive terminal connected to the drains of the transistors of a sixth half bridge, the method comprising:

determining, by a controller, that the input signal voltage either does or does not extend above the upper limit of the positive power supply voltage or below the lower limit of the negative power supply voltage;

if the input signal voltage does not extend above the upper limit of the positive power supply voltage or below the lower limit of the negative power supply voltage, causing, by the controller, each of the transistors to be separately activated or not activated such that the input signal is amplified by the first and second half bridge switching circuits and an amplified output signal provided to the load without any contribution from any voltage on the first and second capacitors so that the voltage applied to the load is a difference between the positive power supply voltage and the negative power supply voltage;

if the input signal voltage extends above the upper limit of the positive power supply voltage or below the lower limit of the negative power supply voltage, determining, by the controller, which of the capacitors should contribute a voltage so that the input signal is amplified to the desired amount and causing each of the transistors to be separately activated or not activated such that the input signal is amplified by some or all of the third, fourth, fifth and sixth half bridge switching circuits and an amplified output signal provided to the load with a contribution from a voltage on some or all of the first, second, third and fourth capacitors.

14. The method of claim 13 further comprising:

receiving, by the controller, the input signal;

digitizing, by the controller, the input signal to create a series of pulses representing the input signal before separately causing each of the transistors to be activated or not activated.

15. The method of claim 14, wherein the input signal is an audio signal, and digitizing the input signal further comprises adding the input signal to a triangle waveform to create the series of pulses representing the input signal.

16. The method of claim 13 wherein the contribution from a voltage on each of the first, second, third and fourth capacitors is equal to the difference between the positive power supply voltage and the negative power supply voltage so that the voltage applied to the load is up to three times the difference between the positive power supply voltage and the negative power supply voltage.

* * * * *